United States Patent [19]

Atsumi

[11] Patent Number: 5,736,781
[45] Date of Patent: Apr. 7, 1998

[54] IC MODULE AND A DATA CARRIER EMPLOYING THE SAME

[75] Inventor: Shiro Atsumi, Tokyo, Japan

[73] Assignee: Oki Electric Industry Co., Ltd., Tokyo, Japan

[21] Appl. No.: 446,640

[22] PCT Filed: Oct. 17, 1994

[86] PCT No.: PCT/JP94/01742

§ 371 Date: May 25, 1995

§ 102(e) Date: May 25, 1995

[87] PCT Pub. No.: WO95/11135

PCT Pub. Date: Apr. 27, 1995

[30] Foreign Application Priority Data

Oct. 18, 1993 [JP] Japan ................... 5-258788

[51] Int. Cl.⁶ .......... H01L 23/48; B42D 15/02; G04K 19/00
[52] U.S. Cl. .......... 257/679; 257/693; 257/668; 257/680; 257/698; 257/727; 257/726; 257/700
[58] Field of Search .................. 257/701, 693, 257/698, 788–795, 773, 774, 709, 730, 729, 667, 668, 700, 679, 727, 726

[56] References Cited

U.S. PATENT DOCUMENTS

| | | | |
|---|---|---|---|
| 4,156,907 | 5/1979 | Rawlings et al. | 364/200 |
| 4,822,988 | 4/1989 | Gloton | 235/492 |
| 5,072,418 | 12/1991 | Boutaud et al. | 364/736 |
| 5,272,374 | 12/1993 | Kodai et al. | 257/679 |
| 5,455,385 | 10/1995 | Newton et al. | 257/700 |
| 5,532,658 | 7/1996 | Tunegawa et al. | 257/693 |
| 5,579,218 | 11/1996 | Ehlig et al. | 364/130 |
| 5,581,127 | 12/1996 | Shinohara | 257/679 |
| 5,598,032 | 1/1997 | Fidalgo | 257/679 |

FOREIGN PATENT DOCUMENTS

| | | | |
|---|---|---|---|
| 0134456 | 8/1983 | Japan | 257/679 |
| 58-138057 | 8/1983 | Japan . | |
| 62-111794 | 5/1987 | Japan . | |
| 62-248695 | 10/1987 | Japan . | |
| 63-82795 | 4/1988 | Japan . | |
| 63-194993 | 8/1988 | Japan . | |
| 63-246292 | 10/1988 | Japan . | |
| 2090466 | 7/1982 | United Kingdom | 257/679 |

*Primary Examiner*—Tom Thomas
*Assistant Examiner*—Alexander Oscar Williams

[57] ABSTRACT

A block-shaped IC module (1) seals an IC chip (30) by an insulator and comprises contact terminals (101 to 106; 111 to 116) and retaining means (14, 15), wherein the contact terminals (101 to 106; 111 to 116) extend from an upper surface to side surfaces of the IC module (1) and they are electrically connected to the IC chip (30) so as to send data to or receive data from the IC chip (30). A data carrier (100, 120, 140, 160) on which the IC module (1) is fitted includes a hole portion (41, 91) having holding members (42, 43; 71, 72; 92, 93) corresponding to the retaining means (14, 15) so as to be engaged with the IC module (1). Accordingly, one IC module (1) can be freely used for various data carriers. Further, the IC module (1) can be thickened as much as possible, thereby improving strength of the IC module (1).

12 Claims, 5 Drawing Sheets

IC MODULE AND A DATA CARRIER EMPLOYING THE SAME

TECHNICAL FIELD

The present invention relates to an IC module having a microcomputer therein which is used by various data carriers such as an integrated circuit (hereinafter referred to as an IC) card with contacts, a contactless IC card, an IC coin and an IC memory card, and a data carrier on which the IC module is fitted.

BACKGROUND TECHNOLOGY

A prior art IC module and a prior art data carrier are disclosed in the following literature.

Literature: Japanese Patent Laid-Open Publication No. 58-138057

The IC module which is disclosed on this literature has a printed circuit board. A wiring pattern is formed in a rear surface of the printed circuit board and a contact terminal pattern is formed on an upper surface of the printed circuit board. The wiring pattern and contact terminal pattern are electrically connected to each other by way of a through hole portion. Further, an IC chip is disposed on the rear surface of the printed circuit board. This IC chip incorporates therein a microcomputer provided with a central processing unit (hereinafter referred to CPU) and a memory wherein a terminal pad formed on the IC chip is connected to the wiring pattern by a wire. These IC chip, wire, etc. are molded out of a resin member so as to form a chip on board (hereinafter referred to as COB) structure.

An IC card as a data carrier employing this IC module consists of a card substrate which is made of vinyl chloride, etc. and formed in a card shape and a spot facing on which the IC module is fitted is provided on the card substrate. The IC card can be manufactured by inserting the IC module into the spot facing and fixing the IC module on the spot facing by an adhesive agent.

If such IC card is inserted into a card reader/writer, signals are sent or received between the card reader/writer and the IC chip through the contact terminal pattern. As a result, a data processing is performed by the IC chip.

There are prepared recently various data carriers for the IC module such as an IC card with contacts, a contactless IC card, an IC coin and an IC memory card. It has been desired for these various data carriers to use the same data of the IC module mutually. It has been also desired to improve strength of the IC module as the data carriers are thinned.

It is an object of the invention to provide an IC module which can be used mutually by various data carriers.

It is another object of the invention to provide an IC module which is improved in its strength.

It is still another object of the invention to provide a data carrier adapted for using the IC module of this invention.

DISCLOSURE OF THE INVENTION

To achieve the above object, the IC module which is fitted on a data carrier and made of an insulating member for sending and receiving data comprises an IC chip including a data processor such as a central processing unit and a terminal through which data is sent to or received from the data processor, an insulator for sealing the IC chip and having a given block-shape, contact terminals which extend from an upper surface of the insulator to confronted side surfaces of the same and which are electrically connected to the terminal of the IC chip, and retaining means which are formed on another confronted side surfaces of the insulator and are detachably engaged with the data carrier.

The data carrier on which the IC module is fitted comprises a substrate which consists of an insulating member and has thickness which corresponds to that of the IC module and dimensions which are greater than those of the IC module, a hole portion which is provided on the substrate and has such dimensions that the IC module can be engaged therein, and holding means which are disposed on inner side surfaces of the hole portion so as to hold the retaining means of the IC module.

With such an arrangement, it is possible to realize the provision of the IC module which can be used mutually by various data carriers and which is improved in its strength and the data carrier adapted for using the IC module of the present invention.

BEST MODE FOR CARRYING OUT THE INVENTION

Figure 1:
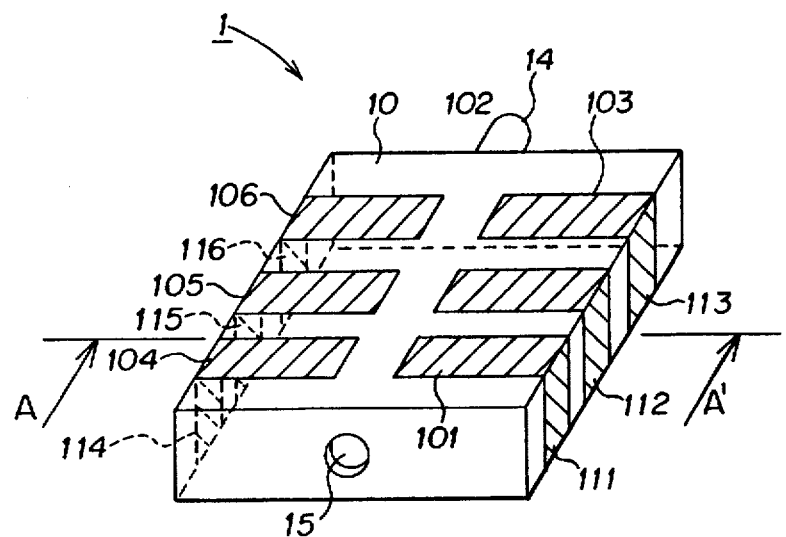
FIG. 1 is a perspective view of an IC module showing an embodiment of the present invention.

The present invention will be now described in detail with reference to drawings. FIG. 1 is a perspective view of an IC module according to an embodiment of the present invention.

The IC module shown in FIG. 1 is used e.g. by an IC card which is one of data carriers. This IC module 1 consists of a substantially rectangular parallelepiped insulator 10 having a thickness as an IC card (e.g., 0.76 mm) which is prescribed by a standard of an international organization for standardization (hereinafter referred to as ISO). Six surface contact terminals 101 to 106 are formed on an upper surface of the insulator 10. These six surface contact terminals 101 to 106 are electrically connected to six side surface contact terminals 111 to 116 which are formed on confronted side surfaces of the insulator 10. Further, a convex portion 14 and a concave portion 15 are formed on the other confronted side surfaces of the insulator 10. The convex portion 14 and concave portion 15 are used as retaining means for detachably engaging with a card substrate, described later.

Figure 2:
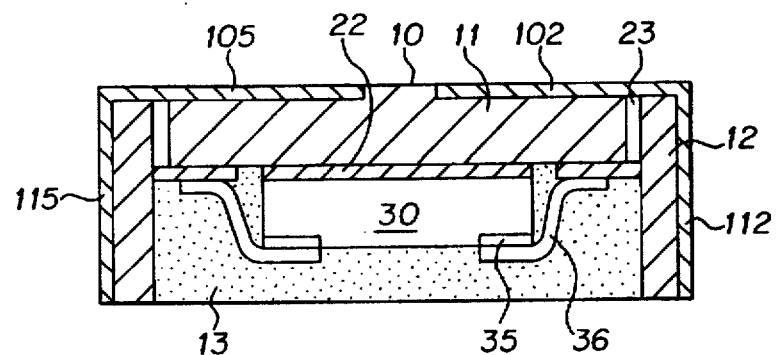
FIG. 2 is a cross-sectional view taken along A–A' of FIG. 1.

A cross-sectional view of the IC module 1 taken along A–A' of FIG. 1 is shown in FIG. 2. In FIG. 2, an IC chip 30 is incorporated in the insulator 10. The insulator 10 comprises a printed circuit board 11 made of glass, epoxy resin, etc. for forming the upper surface thereof, a frame member 12 made of rigid polyvinyl chloride, etc. for forming both side surfaces and a resin member 13 made of epoxy resins, etc. for forming a rear surfaces. The printed circuit board 11 has a plurality of surface contact terminals 101 to 106 on its upper surface and a wiring pattern 22 on its rear surface. A plurality of side surface contact terminals 111 to 116, which are extended from a plurality of surface contact terminals 101 to 106, are formed on the frame member 12 forming the confronted side surfaces of the insulator. There are formed on the printed circuit board 11 conductive through hole portions 23 through which the surface contact terminals 101 to 106, side surface contact terminals 111 to 116 and the wiring pattern 22 are electrically connected to one another. The IC chip 30 is fixed to the rear surface of the printed circuit board 11, and a terminal pad 35 and the wiring pattern 22 respectively formed on the IC chip 30 are electrically connected to each other by way of a wire 36. An inside of the frame member 12 is molded out of the resin member 13 so as to cover the IC chip 30, wire 36, etc.

Figure 3:
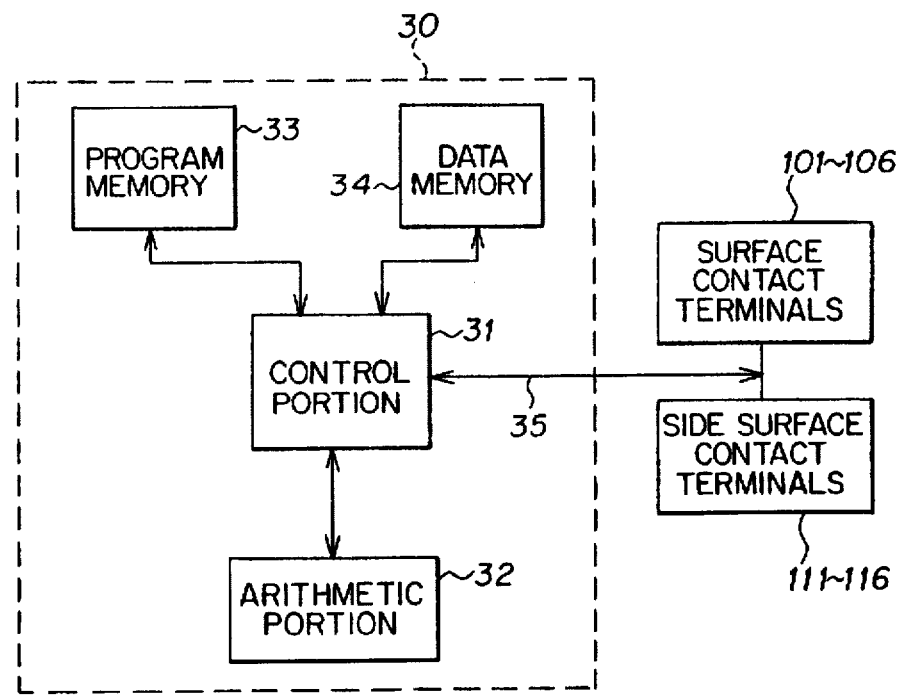
FIG. 3 is a schematic functional block diagram showing a relationship been an IC chip and each contact terminal in the IC module of FIG. 1.

The relationship between the IC chip 30 and each of the surface contact terminals 101 to 106 and 111 to 116 is explained with reference to drawings. FIG. 3 is a schematic functional block diagram showing the relationship between the IC chip 30 and each of the surface contact terminals 101 to 106 and 111 to 116 as shown in FIG. 1.

The IC chip 30 includes, for example, a CPU consisting of a control portion 31 and an arithmetic portion 32, a program memory 33 for storing a program therein, and a data memory 34 for storing data therein. The terminal pad 35 is connected to the control portion 31 and it is electrically connected to the surface contact terminals 101 to 106 and 111 to 116 by way of the wire 36, wiring pattern 22 and the through hole portions 23 as shown in FIG. 2.

In such IC chip 30, data is input to the control portion 31 from the surface contact terminals 101 to 106 or contact terminals 111 to 116 by way of the terminal pad 35. The control portion 31 permits the arithmetic portion 32 to perform an arithmetic operation in accordance with the program which is stored in the program memory 33. A data processing is performed by storing the result of arithmetic operation in the data memory 34, at need.

Figure 4:
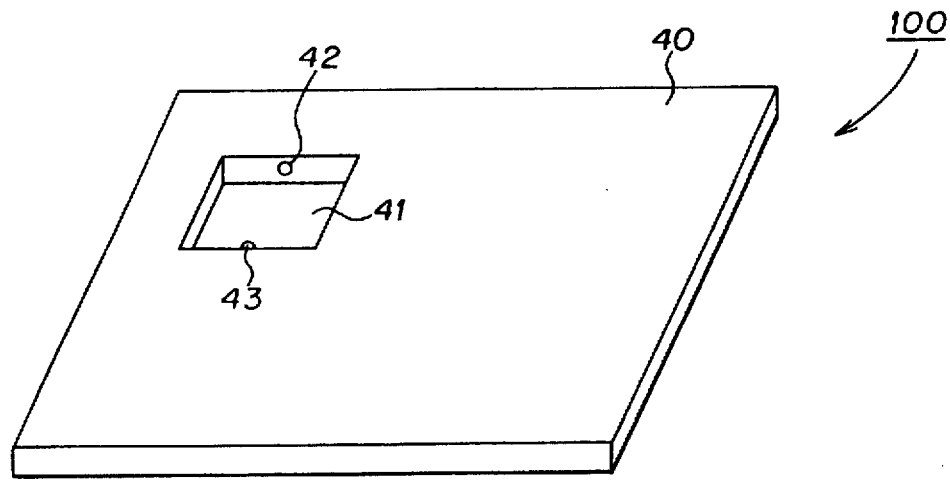
FIG. 4 is a perspective view of an IC card with contacts as a data carrier which is adapted for using the IC module of FIG. 1.

FIG. 4 is a perspective view of an IC card with contacts 100 to which the IC module 1 shown in FIG. 1 can be applied.

The IC card 100 consists of a card substrate 40 which is formed of rigid polyvinyl chloride, etc. and has given dimensions. The dimensions of the IC card 100 are, e.g., 86 mm×54 mm×0.76 mm in accordance with the standard of the ISO. A hole portion 41 is formed on the card substrate 40 at a given position so that the IC module 1 of FIG. 1 is fitted into the hole portion 41. There are formed on confronted inner side surfaces of the hole portion 41, holding means, e.g., a concave portion 42 and a convex portion 43 for detachably engaging with the convex portion 14 and concave portion 15 of the IC module 1. The concave portion 42 is engaged with the convex portion 14 while the convex portion 43 is engaged in the concave portion 15. As a result, the IC module 1 can be detachably engaged in the hole portion 41 of the card substrate 40.

An operation of the IC card 100 employing the IC module 1 having the aforementioned structure will be next described.

For example, if the IC card 100 is inserted into a card reader/writer at the state where the IC module 1 of FIG. 1 is engaged in the hole portion 41 of the card substrate 40 of the IC card with contacts 100 of FIG. 4, the surface contact terminals 101 to 106 of the IC module 1 of FIG. 1 which is fitted on the IC card 100, are electrically connected to terminals of the card reader/writer. When data is input into the surface contact terminals 101 to 106 of the IC module 1 by way of the terminals of the card reader/writer, the control portion 31 inside the IC chip 30 permits the arithmetic portion 32 to perform an arithmetic operation based on the input data in accordance with the program which is stored in the program memory 33. A result of arithmetic operation is output to the card reader/writer by way of the surface contact terminals 101 to 106 of the IC module 1.

The IC module 1 and the IC card 100 employing the IC module 1 according to the present invention have the following effects.

(1) The convex portion 14 and concave portion 15 are provided at the side surfaces of the IC module 1 and the concave portion 42 and convex portion 43 are provided on inner side surfaces of the hole portion 41 of the card substrate 40 for engaging with the convex portion 14 and concave portion 15, thereby providing an engaging structure not an adhesive structure. Since the IC module 1 is used while it is engaged into the hole portion 41 of the card substrate 40, it does not form a dedicated part of a piece of specific IC card with contacts 100 but it can be used for a plurality of IC cards by being replaced with another.

(2) Since the IC module 1 is used while it is engaged in the hole portion 41 of the card substrate 40, the thickness of the IC module 1 can be made the same as the maximum thickness of the card substrate which is allowable by a standard (e.g., 0 76 mm in the standard of the ISO). Accordingly, strength of the IC module 1 can be improved.

Figure 5:
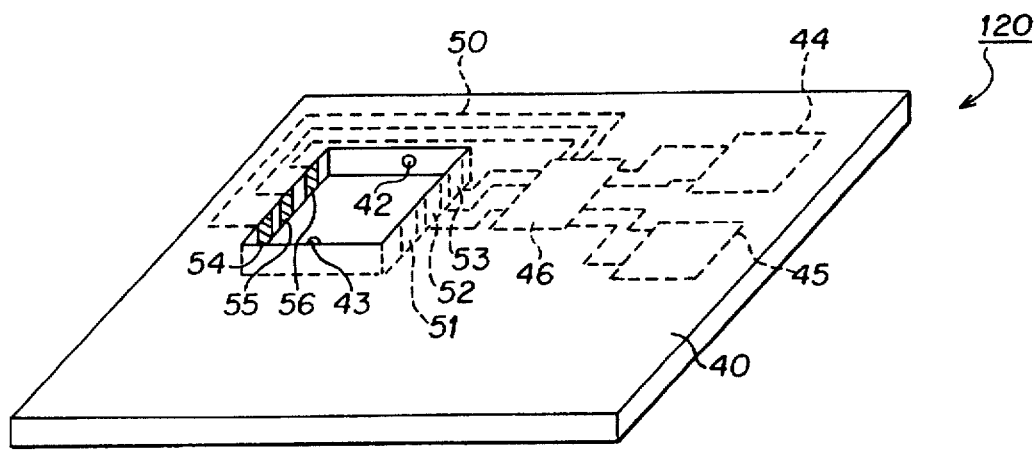
FIG. 5 is a perspective view of a contactless IC card as a data carrier which is adapted for using the IC module of FIG. 1.

A perspective view of a contactless IC card to which the IC module 1 of FIG. 1 can be applied is shown in FIG. 5. Elements which are common to those in FIGS. 1 to 3 are denoted at the same numerals.

A contactless IC card 120 consists of the card substrate 40 having given dimensions (e.g., 86 mm×54 mm×0.76 mm in case of the ISO standard) on which the hole portion 41 is formed like that of FIG. 4.

An electronic circuit is provided in the card substrate 40 and it comprises, for example, coils 44 and 45 and an interface IC 46 connected to these coils 44 and 45. Further, conductive pattern portions 51 to 56 are formed on inner side surfaces of the hole portion 41 for contacting the contact terminals 111 to 116 of the IC module 1 of FIG. 1. The conductive pattern portions 51 to 56 are connected to conductive patterns 50 which are drawn or extended from terminals of an interface IC 46. The concave portion 42 and convex portion 43 for detachably engaging with the convex portion 14 and concave portion 15 of the IC module 1 of FIG. 1 are formed on the inner side surfaces of the hole portion 41. The coils 44 and 45 receive a power energy by way of an interface device as an external device, not shown, due to electromagnetic induction produced therein, or send data or receive data between themselves and this interface device. The interface IC 46 connected to the coils 44 and 45 has function to smooth electromagnetic energy from the coils 44 and 45 or shape signals which are sent or received therethrough or to send data or receive data between the IC chip 30 and the interface device, when connected to the IC chip 30.

Figure 6:
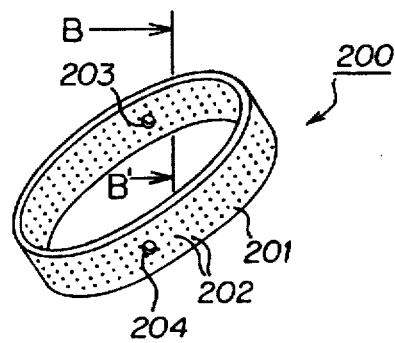
FIG. 6 is a perspective view of an anisotropic conductive film.

It is preferable to use, for example, an anisotropic conductive film 200 of FIG. 6 so that the contactless IC card 120 of FIG. 5 to suitably employ the IC module 1 of FIG. 1.

The anisotropic conductive film 200 consists of an elastic or stretchable annular insulating tape 201. A plurality of conductive parts 202 are scattered in the anisotropic conductive film 200. A scattering state of the conductive parts 202 will be now described with reference to FIG. 7.

Figure 7:
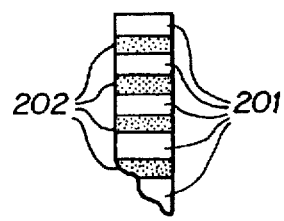
FIG. 7 is a cross-sectional view taken along B–B' of FIG. 6.

FIG. 7 is a cross-sectional view taken along B–B' of FIG. 6. As shown in FIG. 7, the conductive parts 202 extend in the direction of a film thickness of the insulating tape 201 and they are arranged with the space of about 10 µm. Each of the conductive parts 202 is provided in the anisotropic conductive film 200 so as to penetrate the anisotropic conductive film 200, i.e. extend from the upper surface to the rear surface of the anisotropic conductive film 200. The anisotropic conductive film 200 has hole portions 203 and 204 at positions corresponding to the convex portion 14 and concave portion 15 of the IC module 1. The anisotropic conductive film 200 has a tapered portion at a lower end thereof. When the anisotropic conductive film 200 is fitted on the IC module 1, it is positioned near the rear surface of the IC module 1. As a result, when the IC module 1 is engaged in the hole portion 41 of the data carrier, the anisotropic conductive film 200 fitted on the IC module 1 is prevented from being come off and it is easily interposed between the IC module 1 and the data carrier.

Figure 8:
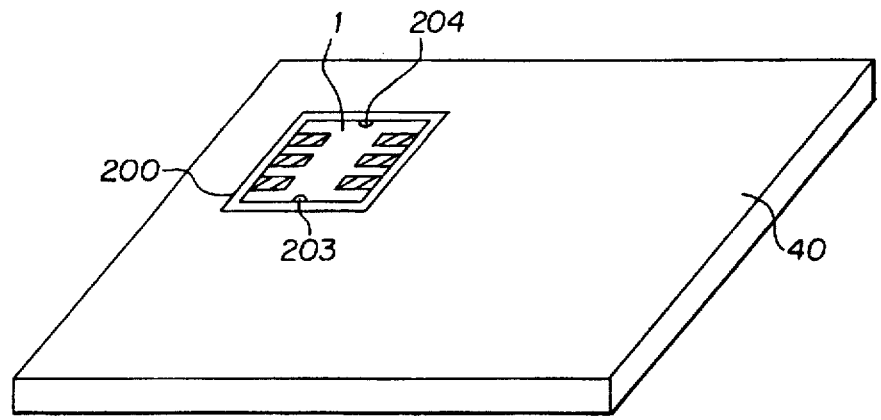
FIG. 8 is view showing a state where the conductive film of FIG. 6 is fitted on the IC module of FIG. 1.

A state where the anisotropic conductive film 200 is fitted on the IC module 1 of FIG. 1 is shown in FIG. 8.

In FIG. 8, the hole portions 203 and 204 of the anisotropic conductive film 200 are positioned to correspond to the convex portion 14 and concave portion 15 of the IC module 1. The contact terminals 111 to 116 of the IC module 1 are electrically connectable to an external interface device by way of the conductive parts 202.

Figure 9:
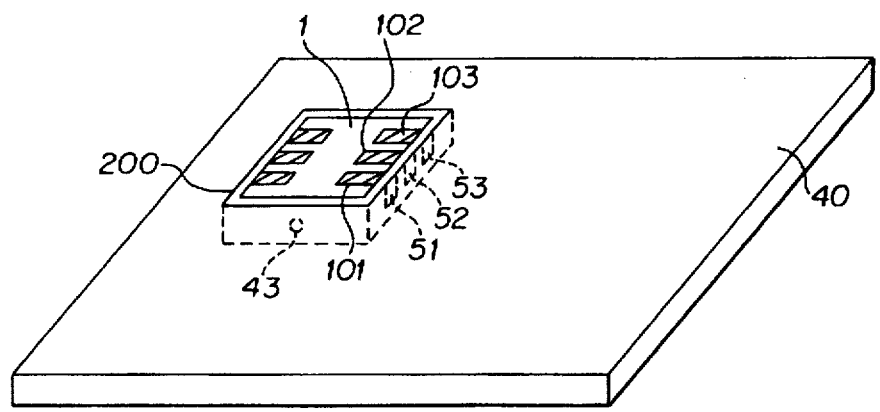
FIG. 9 is a view showing a state of use of the IC module wherein the conductive film of FIG. 8 is fitted on the contactless IC card of FIG. 5.

A state where the IC module 1 of FIG. 8 is fitted on the card substrate 40 of the contactless IC card 120 of FIG. 5 is shown in FIG. 9. In FIG. 9, the surface contact terminals of the IC module 1, e.g. the surface contact terminals 101 to 103 are electrically connected to the conductive pattern portions 51 to 53 provided on the card substrate 40 by way of the contact terminals 111 to 113 and a plurality of conductive parts 202 of the anisotropic conductive film 200. At this time, since a plurality of conductive parts 202 are electrically independent of each other by the insulating tape 201, the conductive pattern portions 51 to 53 are not electrically short circuited by the anisotropic conductive film 200. The convex portion 43 and concave portion 42 (not shown in FIG. 9) of the card substrate 40 are engaged in the concave portion 15 and convex portion 14 (not shown in FIG. 9) of the IC module 1 so as to fix the IC module 1 to the hole portion 41 of the card substrate 40. However, since the dimensions of the IC module 1 are slightly smaller than those of the hole portion 41 of the card substrate 40, the former has weak adhesion to the latter.

However, since the anisotropic conductive film 200 is interposed between the IC module 1 and card substrate 40, the adhesion of the IC module 1 to the card substrate 40 is improved.

When the thus assembled contactless IC card 120 is inserted into the interface device, electric energy is supplied from the interface device to the contactless IC card 120 due to electromagnetic induction produced in the coils 44 and 45. The electromagnetic energy supplied to the contactless IC card 120 is smoothed by the interface IC 46 and then it is supplied to the IC chip 30 in the IC module 1 by way of the conductive pattern 50, conductive pattern portions 51 to 56, anisotropic conductive film 200 and contact terminals 111 to 116 of the IC module 1. The IC chip 30 is driven upon reception of the electromagnetic energy. When a signal is supplied from the interface device to the contactless IC card 120, the same signal is supplied to the interface IC 46 by way of the coils 44 and 45 due to electromagnetic induction produced in the coils 44 and 45. The interface IC 46 shapes the signal supplied from the interface device and supplies the shaped signal to the IC chip 30 in the IC module 1 by way of the conductive pattern 50, conductive pattern portions 51 to 56, anisotropic conductive film 200 and the contact terminals 111 to 116 of the IC module 1. The IC chip 30 permits the arithmetic portion 32 to perform arithmetic operation in accordance with the program which is stored in the program memory 33 in response to the signal, e.g., supplied from the interface IC 46. A result of arithmetic operation is stored in the data memory 34. The result of arithmetic operation which is stored in the data memory 34 is supplied to the interface device due to electromagnetic inductance by way of the contact terminals 111 to 116, anisotropic conductive film 200, conductive pattern portions 51 to 56, conductive pattern 50, interface IC 46 and the coils 44 and 45.

Accordingly, even if the surface contact terminals 101 to 106 of the IC module 1 engaged with the card substrate 40 are not directly connected to the interface device, the data can be sent and received between the IC chip 30 and the interface device due to electromagnetic inductance produced in the coils 44 and 45.

As mentioned above, the IC module 1 and contactless IC card 120 employing the IC module 1 have the following effects.

(1) The interface IC 46 and the IC chip 30 in the IC module 1 are electrically connected to each other by providing the conductive pattern portions 51 to 56, which are extended from the conductive pattern 50, on the inner side surfaces of the hole portion 41 formed on the card substrate 40, and permitting the conductive pattern portions 51 to 56 to contact the contact terminals 111 to 116 of the IC module 1. Accordingly, it is possible to mount the IC module 1 not only on the IC card with contacts having no existing electronic circuit in the card substrate 40 as shown in FIG. 4 but also on the contactless IC card having the existing electronic circuit such as the interface IC 46 in the card substrate 40 as shown in FIG. 5.

(2) It is possible to use the IC module 1 for a plurality of IC cards like the IC card with contacts by replacing it with another. Further, since the thickness of the IC module 1 can be made the same as the maximum thickness of the card substrate 40 which is allowable by the standard, strength of the IC module 1 can be improved.

(3) When the contactless IC card 120 and IC module 1 are electrically connected to each other by the anisotropic conductive film 200, data transfer can be assured and adhesion between the contactless IC card 120 and IC module 1 can be improved.

Figure 10:
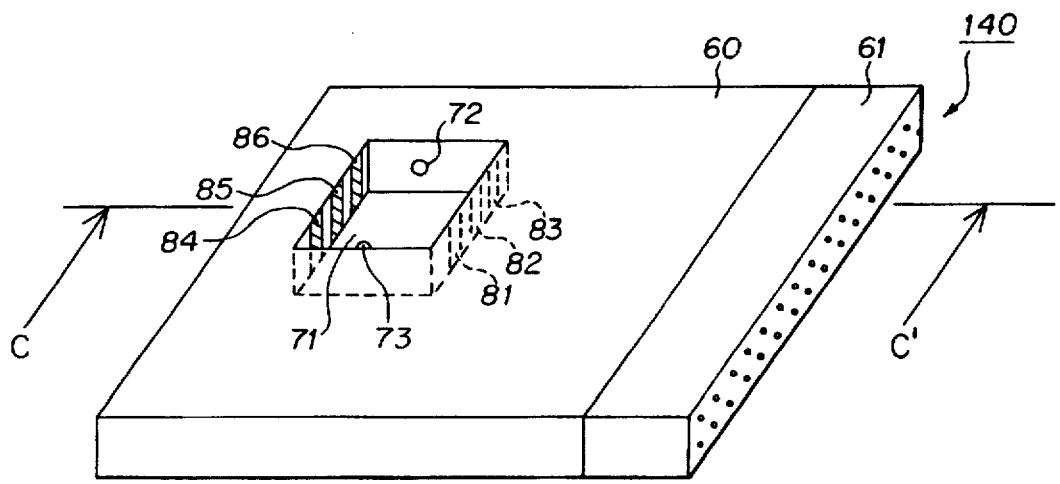
FIG. 10 is a perspective view of an IC memory card as a data carrier which is adapted for using the IC module of FIG. 1.
Figure 11:
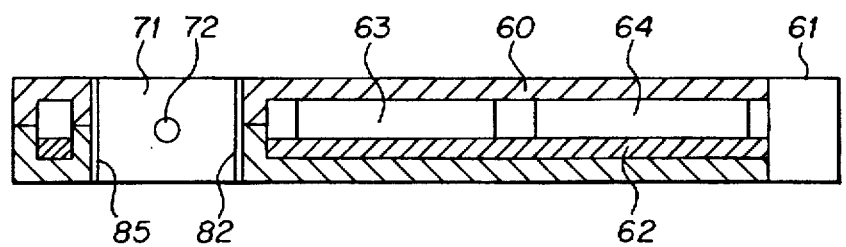
FIG. 11 is a cross-sectional view taken along C–C' of FIG. 10.

A perspective view of an IC memory card to which the IC module 1 of FIG. 1 can be applied is shown in FIG. 10. FIG. 11 is a cross-sectional view taken along C–C' of FIG. 10.

An IC memory card 140 has various dimensions. Typical dimensions are 86 mm×54 mm×3.3 mm in accordance with a standard of the Japan Electronic Industry Development Association (JEIDA) if the card is mainly intended to be used as, e.g., an auxiliary memory of a personal computer. The IC memory card 140 meeting the standard of the JEIDA comprises a cover member 60 having dimensions of 86 mm×54 mm×3.3 mm and a connector 61 which is attached to one side surface of the cover member 60. A printed circuit board 62 is provided in the cover member 60 and there are provided on the printed circuit board an IC memory chip 63 for storing therein a plurality of data and an interface circuit 64 such as a dedicated gate array for performing an interface control between it and a bus of a personal computer, wherein the IC memory chip 63 and interface circuit 64 are connected to the connector 61.

When the IC memory card 140 meeting the standard of the JEIDA is inserted into an I/O portion of the personal computer, the interface circuit 64 is connected to the bus in the personal computer by way of the connector 61. As a result, an interface control between the bus in the personal computer and the IC memory chip 63 is performed by way of the interface circuit 64. Accordingly, it is possible to use the IC memory card 140 as an auxiliary memory of the personal computer.

The IC memory card 140 of this type meeting the standard of the JEIDA is mainly intended to be used as an auxiliary memory of a personal computer. However, with the spread of an IC card or an IC memory card, it is desired to check an access right to the personal computer by connecting the IC card to the personal computer without interposing a card reader/writer therebetween or letting the IC memory card have an ID function (function to identify a user) of the IC card. Accordingly, an IC memory card is desired to partake of the IC card.

Accordingly, as shown in FIG. 10, a hole portion 71 in which the IC module 1 of FIG. 1 is engaged is formed on the IC memory card 140 having the conventional dimensions (e.g., 86 mm×54 mm×3.3 mm in case of the standard of the JEIDA). There are formed on inner side surfaces of the hole portion 71 a concave portion 72 with which the convex portion 14 of the IC module 1 of FIG. 1 is engaged and a convex portion 73 with which the concave portion 15 of the IC module 1 of FIG. 1 is engaged. Further, conductive patterns on the printed circuit board 62 are extended to the inner side surfaces of the hole portion 71 to form conductive pattern portions 81 to 86 so as to correspond to the surface contact terminals 101 to 106 of the IC module 1 of FIG. 1.

The thickness of the IC module 1 of FIG. 1 is preferable to be the same as that of the IC card of FIG. 4 or 5. Alternatively, the thickness of the IC module 1 may be the same as that of the IC memory card 140 of FIG. 10.

When the IC module 1 of FIG. 1 is engaged in the hole portion 71 of the IC memory card 140 having the aforementioned structure, the convex portion 14 of the IC module 1 is engaged in the concave portion 72 of the hole portion 71 while the concave portion 15 of the IC module 1 is engaged with the convex portion 73 of the hole portion 71, which results in fitting of the IC module 1 on the IC memory card 140. Accordingly, the contact terminals 111 to 116 of the IC module 1 and the conductive patterns 81 to 86 of the hole portion 71 contact one another so that the IC module 1 is connected to the IC memory chip 63, interface circuit 64 and the connector 61.

When the thus assembled IC memory card 140 is inserted into, e.g., an I/O portion of a personal computer, data can be sent or received between an internal bus of the personal computer and the IC module 1 by way of the interface circuit 64. Accordingly, the IC memory card 140 can be operated as an IC memory card which partakes both of the IC card and IC memory card.

The IC module 1 and IC memory card 140 employing the IC module 1 have the following effects.

(1) The existing electronic circuit such as the IC chip 63 and interface circuit 64 and the IC chip 30 in the IC module 1 are electrically connected to each other by forming the hole portion 71 on the IC memory card 140, providing the conductive pattern portions 81 to 86 extended from the conductive pattern on the printed circuit board 62, and permitting the conducive pattern portions 81 to 86 to contact the contact terminals 111 to 116 of the IC module 1. Accordingly, the IC module 1 can be connected to the IC memory card 140 having the existing electronic circuit such as the IC memory chip 63 and the interface circuit 64 so that the IC memory card 140 can be operated also as the IC card.

(2) It is possible to use the IC module 1 for a plurality of IC memory cards like the contactless IC card 120 by replacing it with another. Further, since the thickness of the IC module 1 can be made the same as the maximum thickness of the card substrate 40 which is allowable by the standard, strength of the IC module 1 can be improved.

(3) Still further, when the IC memory card 140 and IC module 1 are electrically connected to each other using the anisotropic conductive film 200 of FIG. 6, data transfer can be assured and adhesion between the contactless IC card 120 and IC module 1 can be improved.

Figure 12:
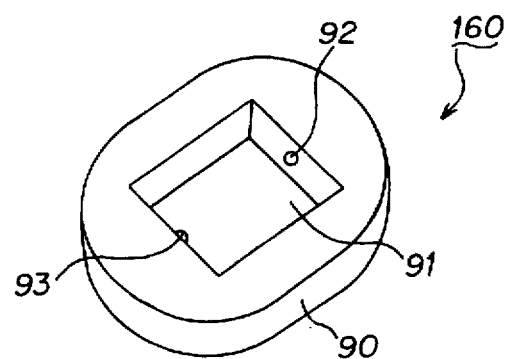
FIG. 12 is a perspective view of an IC coin as a data carrier which is adapted for using the IC module of FIG. 1.

A perspective view of an IC coin to which the IC module 1 can be applied is shown in FIG. 12.

An IC coin 160 consists of a discoid substrate 90 having a hole portion 91 in which the IC module 1 of FIG. 1 is engaged. A concave portion 92 and a convex portion 93 are formed on inner side surfaces of the hole portion 91 so as to correspond to the convex portion 14 and concave portion 15 of the IC module 1 of FIG. 1. In such IC coin 160, functions and effects, which are substantially the same as those of the aforementioned various data carriers, can be obtained by engaging the IC module 1 of FIG. 1 in the hole portion 91.

Figure 13:
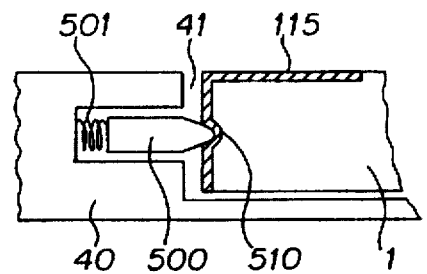
FIG. 13 is a view of another conductive pattern provided in a hole portion of a data carrier such as the contactless IC card.

Another embodiment of a conductive pattern provided on the hole portion 41 of the data carrier such as the contactless IC card is shown in FIG. 13. As a conductive pattern provided on the hole portion 41 of the data carrier such as the contactless IC card, a projecting conductive terminal 500 having an acute angle at its tip end is fixed on the hole portion 41 so as to project toward the inner surface of the card substrate 40. The projecting conductive terminal 500 is urged toward the confronted inner surface of the card substrate 40 by urging means 501 such as a conductive spring which is electrically connected to an electronic circuit inside the card substrate 40. With such an arrangement, when the IC module 1 is engaged in the hole portion 41 of the data carrier, the side surface contact terminal (e.g., 115) of the IC module 1 electrically contacts the projecting conductive terminal 500 with assurance without using the anisotropic conductive film 200 of FIG. 6. Since the projecting conductive terminal 500 is movable by the urging means when the IC module 1 is engaged in the hole portion 41, a part of the projecting conductive terminal 500 projecting from the inner side surface of the hole portion 41 does not obstruct the engagement of the IC module 1 in the hole portion 41. At this time, if a concave portion 510 is provided on the side surface contact terminal 115 of the IC module 1 at the portion where the side surface contact terminal 115 contacts the projecting conductive terminal 500 of the data carrier so that the tip end of the projecting conductive terminal 500 can be engaged in the concave portion 510, the IC module 1 is supported by the projecting conductive terminal 500 when the IC module 1 is engaged with the data carrier, which results in the improvement of fitting of the IC module 1 on the data carrier. Further, since an electric contact area between the projecting conductive terminal 500 and the side surface contact terminal 115 of the IC module 1 is increased by providing a conductive material inside the concave portion 510 like the side surface contact terminal 115, the IC module 1 can be electrically connected to the card substrate 40 with more assurance.

The present invention is not limited to the aforementioned embodiments but can be varied variously. For example, the IC module shown in FIG. 1 can be applied to various data carriers such as an IC tag and an IC key which are not shaped like a card. Further, the IC module 1 shown in FIG. 1 may be formed of another shape such as a discoid one. In such a case, a hole portion of the IC card may be varied correspondingly to the shape of the IC module 1. Still further, an internal structure of the IC module 1 shown in FIG. 1 may be changed to a structure other than that of FIG. 2. Still further, an internal structure of the IC chip 30 in the IC module 1 may be changed to a structure other than that of FIG. 3.

When the IC module 1 is removed from the various data carriers, it can be easily pushed from the rear surface of the substrate if the hole portion of he data carrier is a through hole portion. If the hole portion is not the through hole portion, the IC module 1 can be easily removed by providing a claw portion for removal purpose on the upper surface of the IC module 1.

If the IC module is not fitted on the data carrier, a cover for protecting the hole portion of the data carrier or a dummy IC module may be fitted on the data carrier.

INDUSTRIAL UTILIZATION

As described in detail above, since the IC module according to the present invention comprises an IC chip provided inside the block-shaped insulator, a plurality of contact terminals which are provided on the upper and side surfaces of the insulator and are electrically connected to the IC chip, and retaining means provided on the side surfaces of the insulator, if the member on which the IC module is fitted is engaged with the IC module by the retaining means, the IC module can be electrically connected to the member on which the IC module is fitted by way of the contact terminals. Accordingly, the IC module can be fitted on various data carriers such as the IC card with contacts having no existing electronic circuit, contactless IC card having an existing electronic circuit, and the IC memory.

Further, since the IC module is structured to be engaged with the member on which the IC module is fitted, it does not form a dedicated part of a piece of specific card but can be used for other data carriers by being replaced. Still further, since the IC module is structured to be engaged with the member on which the IC module is fitted, the thickness of the IC module can be made the same at maximum as that of the member on which the IC module is fitted, so that the IC module can be improved in its strength.

Still further, since the data carrier serving as the member on which the IC module is fitted is structured to have a hole portion in which the IC module is engaged, the IC module can be simply and surely engaged in the hole portion by the retaining means and holding means. Still more further, the IC module of the present invention can be applied to the data carrier having the existing electronic circuit by providing the conductive pattern, which is electrically connected to the existing electronic circuit, on the inner side surfaces of the hole portion.

I claim:

1. An IC module mounted to a data carrier for sending and receiving data between the IC module and the data carrier,
   wherein the IC module comprises:
   (a) an IC chip including a data processor comprising a central processing unit and a terminal through which data is sent to and received from said data processor,
   (b) an insulator for carrying said IC chip and having a given block-shape,
   (c) contact terminals which extend from an upper surface of said insulator to particular side surfaces of said insulator and which are electrically connected to said terminal of said IC chip, and
   (d) retaining means which are formed on side surfaces of said insulator other than said particular side surfaces for detachably engaging the IC module with said data carrier; and said data carrier comprising:
   (a) a substrate formed of an insulating member having a thickness which corresponds to that of said IC module and surface dimensions greater than that of said IC module,
   (b) a hole portion provided on said substrate and sized so that said IC module can be accommodated in said hole portion,
   (c) data processing means arranged in said substrate for sending data to and receiving data from an external device, and
   (d) internal terminals provided on inner peripheral surfaces of said hole portion and electrically connected to said data processing means so as to transfer said data between said internal terminals and said data processing means; and a conductive member interposed between said IC module and said data carrier for electrically connecting said contact terminals of said IC module to said internal terminals of said data carrier when said IC module is engaged in said hole portion of said data carrier.

2. The IC module according to claim 1, wherein said conductive member is an annular and elastic anisotropic conductor.

3. The IC module according to claim 2, wherein said conductive member has hole portions at positions corresponding to said retaining means of said IC module.

4. An IC module mounted to a data carrier for sending data and receiving data,
   wherein the data carrier comprises an electrical circuit; and
   wherein the IC module comprises:
   an IC chip having an arithmetic portion and a program memory, wherein the arithmetic portion performs an arithmetic operation in accordance with a program stored in the program memory;
   a plurality of contact terminals formed on the IC module and electrically connected to the IC chip, including a first contact terminal formed on the IC module for sending data to and receiving data from an external device, and a second contact terminal formed on the IC module for coupling the IC module to said electrical circuit arranged in the data carrier; and a retaining member formed on the IC module for removably attaching the IC module to the data carrier.

5. An IC module mounted to a data carrier for sending data and receiving data, wherein the data carrier comprises an electrical circuit, and wherein the IC module comprises:

a first contact terminal formed on the IC module for sending to and receiving Read/Write control information from an external device; and a second contact terminal formed on the IC module for coupling the IC module to said electrical circuit arranged in the data carrier.

6. A data carrier according to claim 5, wherein the electrical circuit on the data carrier comprises an interface IC and a coil.

7. A combination of an IC module mounted to a data carrier for sending data and receiving data between the IC module and a data processing circuit in the data carrier, wherein the IC module comprises:
(a) an IC chip, and
(b) contact terminals formed on the IC module and electrically connected to the IC chip;

wherein the data carrier comprises:
(a) a substrate having a hollow portion for accommodating the IC module therein,
(b) the data processing circuit arranged in the substrate, and
(c) internal terminals formed on an inner periphery of the hollow portion of the substrate and electrically coupled to the data processing circuit; and a conductive member interposed between the IC module and the data carrier for electrically coupling the contact terminals of the IC module to the internal terminals of the data carrier when the IC module is accommodated in the hollow portion of the data carrier.

8. An IC module mounted on a data carrier according to claim 7, wherein the conductive member is an annular and elastic anisotropic conductor.

9. An IC module mounted on a data carrier according to claim 8, further comprising:

a retaining element provided on the IC module;

a holder element provided on the inner periphery of the hollow portion of the data carrier positioned so as to hold the retaining element of the IC module; and hole portions in the conductive member at positions corresponding to a position of the retaining element of the IC module.

10. A method for mounting an IC module to a data carrier, for sending and receiving data between the IC module and the data carrier, comprising the steps of:

forming the IC module by:
(a) providing an IC chip including a data processor comprising a central processing unit and a terminal through which data is sent to and received from said data processor,
(b) placing said IC chip on an insulator having a given block-shape,
(c) providing contact terminals which extend from an upper surface of said insulator to particular side surfaces of said insulator and electrically connecting said contact terminals to said terminal of said IC chip, and
(d) forming retaining means on side surfaces of said insulator other than said particular side surfaces for detachably engaging the IC module with said data carrier; and forming said data carrier by:
(a) forming a substrate from an insulating member having a thickness which corresponds to that of said IC module and surface dimensions greater than that of said IC module,
(b) providing a hole portion on said substrate sized so that said IC module can be accommodated in said hole portion,
(c) arranging data processing means in said substrate for sending data to and receiving data from an external device, and
(d) providing internal terminals on inner peripheral surfaces of said hole portion and electrically connecting said internal terminals to said data processing means so as to transfer said data between said internal terminals and said data processing means; and interposing a conductive member between said IC module and said data carrier for electrically connecting said contact terminals of said IC module to said internal terminals of said data carrier when said IC module is engaged in said hole portion of said data carrier.

11. The method for mounting an IC module to a data carrier according to claim 10, wherein said conductive member is an annular and elastic anisotropic conductor.

12. The method for mounting an IC module to a data carrier according to claim 11, wherein said conductive member has hole portions at positions corresponding to said retaining means of said IC module.

* * * * *